(12) United States Patent
Naniwa et al.

(10) Patent No.: US 11,705,153 B1
(45) Date of Patent: Jul. 18, 2023

(54) HARD DISK DRIVE SUSPENSION PAD PRE-SOLDER FORMATION AND GUIDING

(71) Applicant: Western Digital Technologies, Inc., San Jose, CA (US)

(72) Inventors: Irizo Naniwa, Fujisawa (JP); Yoshio Uematsu, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/702,691

(22) Filed: Mar. 23, 2022

(51) Int. Cl.
*G11B 5/48* (2006.01)
*H05K 3/34* (2006.01)

(52) U.S. Cl.
CPC .......... *G11B 5/4853* (2013.01); *G11B 5/4826* (2013.01); *H05K 3/3452* (2013.01); *H05K 3/3485* (2020.08); *G11B 2220/2516* (2013.01); *H05K 2203/107* (2013.01)

(58) Field of Classification Search
None
See application file for complete search history.

(56) References Cited

U.S. PATENT DOCUMENTS

| | | | | |
|---|---|---|---|---|
| 4,761,699 | A * | 8/1988 | Ainslie | G11B 21/16 |
| 5,821,494 | A * | 10/1998 | Albrecht | G11B 5/4853 |
| | | | | 228/111.5 |
| 6,985,332 | B1 * | 1/2006 | Sluzewski | G11B 5/3103 |
| | | | | 360/234.6 |
| 7,403,357 | B1 | 7/2008 | Williams | |
| 8,031,437 | B2 | 10/2011 | Suzuki et al. | |
| 8,325,447 | B1 | 12/2012 | Pan | |
| 8,477,457 | B2 | 7/2013 | Matsumoto et al. | |
| 8,792,212 | B1 | 7/2014 | Pan et al. | |

(Continued)

FOREIGN PATENT DOCUMENTS

| | | | | |
|---|---|---|---|---|
| CN | 102081930 A | * | 6/2011 | ............. G11B 5/486 |
| CN | 106900137 A | * | 6/2017 | ........... G11B 5/4833 |

(Continued)

OTHER PUBLICATIONS

Chen, Hongtao et al., Mechanical shock modeling and testing of lead-free solder joint in hard disk drive head assembly, 2005 International Conference on Asian Green Electronics, Session 4, Apr. 2005, pp. 192-196, IEEE Xplore.

(Continued)

*Primary Examiner* — William J Klimowicz
(74) *Attorney, Agent, or Firm* — John D. Henkhaus

(57) ABSTRACT

A hard disk drive flexure assembly includes a metal substrate having a gap between a root side and a slider side, a base layer and a first conductive layer that each bridges the gap, and a plurality of electrical pads where the pads extend to the slider side of the flexure so as to positionally overlap with a slider end edge and corresponding slider electrical pads. Pre-solder bumps are formed on each pad. This configuration facilitates formation of a functional solder bridge between the flexure and the slider because the melted solder can readily spread on the extended flexure pad surface and reach the slider pad when the pre-solder bump is heated, as the pad material has higher solder wettability than that of a cover layer material. These techniques are especially relevant with narrow, high-density, small pitch electrical pads.

19 Claims, 8 Drawing Sheets

(56) References Cited

U.S. PATENT DOCUMENTS

| | | | |
|---|---|---|---|
| 9,640,757 B2 | 5/2017 | Zheng | |
| 9,728,211 B1 | 8/2017 | Murata et al. | |
| 10,600,435 B2 | 3/2020 | Klarqvist | |
| 10,706,880 B1 | 7/2020 | Grimm et al. | |
| 11,062,731 B1 | 7/2021 | Satoh et al. | |
| 11,355,144 B1* | 6/2022 | Stephan | G11B 5/6082 |
| 2003/0070834 A1* | 4/2003 | Tsuchiya | G11B 5/4853 174/250 |
| 2005/0195529 A1* | 9/2005 | Tsuchida | G11B 5/4853 360/234.5 |
| 2005/0199680 A1* | 9/2005 | Matsumoto | H05K 3/3442 228/101 |
| 2006/0139809 A1* | 6/2006 | Matsumoto | H05K 3/3442 360/234.5 |
| 2006/0238921 A1* | 10/2006 | Matsumoto | G11B 5/4826 360/234.5 |
| 2008/0170333 A1 | 7/2008 | Ohsawa et al. | |
| 2009/0091860 A1 | 4/2009 | Dela Pena et al. | |
| 2010/0321829 A1 | 12/2010 | Hutchinson et al. | |
| 2011/0019311 A1 | 1/2011 | Greminger et al. | |
| 2014/0008101 A1* | 1/2014 | Brandts | H01R 43/02 174/126.1 |
| 2016/0012839 A1 | 1/2016 | Arai et al. | |
| 2020/0098388 A1* | 3/2020 | Davidson | G11B 5/4826 |

FOREIGN PATENT DOCUMENTS

| | | | | |
|---|---|---|---|---|
| JP | H10335798 A | | 12/1998 | |
| JP | 2001043647 A | * | 2/2001 | G11B 5/4826 |
| JP | 2003123217 A | * | 4/2003 | G11B 5/484 |
| JP | 2005243145 A | * | 9/2005 | G11B 5/4853 |
| JP | 2009181652 A | * | 8/2009 | G11B 5/4826 |
| JP | 5869451 B2 | | 2/2016 | |
| JP | 2017107629 A | * | 6/2017 | G11B 5/483 |

OTHER PUBLICATIONS

Naka, Kohichiroh, Hard Disk Drive Suspension Pad Peel-Prevention Configuration, U.S. Appl. No. 17/551,911, filed Dec. 15, 2021.

Matthes, Liane et al., Suppression of cross-track vibrations using a self-sensing micro-actuator in hard disk drives, Microsystem Technologies, Accepted: May 7, 2012 / Published online: Jun. 1, 2012, pp. 1309-1317, vol. 18, Springer-Verlag.

* cited by examiner

HARD DISK DRIVE SUSPENSION PAD PRE-SOLDER FORMATION AND GUIDING

FIELD OF EMBODIMENTS

Embodiments of the invention may relate generally to hard disk drives, and particularly to approaches to pre-solder bump formation for suspension electrical pads.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") housed in a slider that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic-recording disk, which in turn magnetizes a small area on the recording medium.

To write data to or read data from the recording medium, the head has to receive instructions from a controller. Hence, the head is electrically connected to the controller in some manner such that not only does the head receive instructions to read/write data, but the head can also send information back to the controller regarding the data read and written. Typically, a flexible printed circuit (FPC) mounted on a suspension is used to electrically transmit signals from the read-write head to other electronics within an HDD. At one end, the FPC-suspension assembly and the head are electrically connected together typically with solder at the head slider. To connect these components with solder, solder balls between the suspension electrical pads and the slider electrical pads are heated, such as by using a laser in a solder bond jet (SBJ) procedure, for example.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Figure 1:
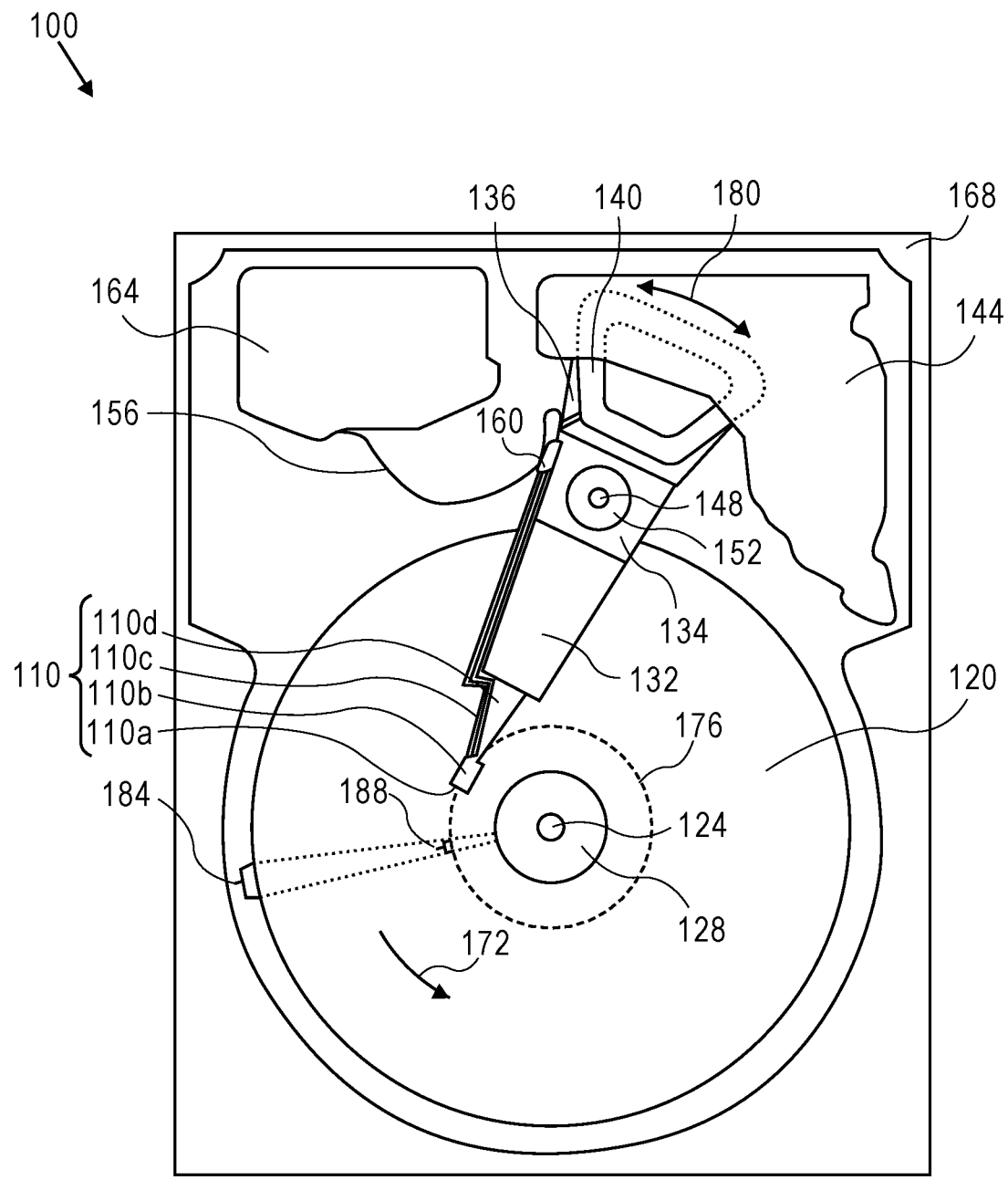
FIG. 1 is a plan view illustrating a hard disk drive, according to an embodiment.

Generally, approaches to the formation and guiding of pre-solder bumps for suspension electrical pads are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

Introduction

TERMINOLOGY

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

CONTEXT

Recall that a flexible printed circuit (FPC) mounted on a suspension is typically used to electrically transmit signals from the read-write head to other electronics within a hard disk drive (HDD), that the FPC-suspension assembly and the head are electrically connected together with solder at the head slider via electrical pads on the respective components. The number of slider electrical connections, and thus the number of electrical pads on the slider and on the flexure of the suspension, is expected to increase over time due to the implementation of new technologies such as dual thermal flying height control (TFC), two-dimensional magnetic recording (TDMR), energy-assisted magnetic recording (EAMR) such as heat-assisted magnetic recording (HAMR), microwave-assisted magnetic recording (MAMR), and the like. Consequently, to make room for the additional electrical pads the distance between adjacent pads is expected to narrow (or decrease) and the size of the pads is expected to decrease accordingly, including narrowing the pads to inhibit undesirable solder bridges (e.g., electrical bonds) between adjacent pads. Hence, as the pads increase in number it becomes more difficult to connect the pads as needed using the traditional SBJ solder balls, equipment and procedures.

Figure 2A:
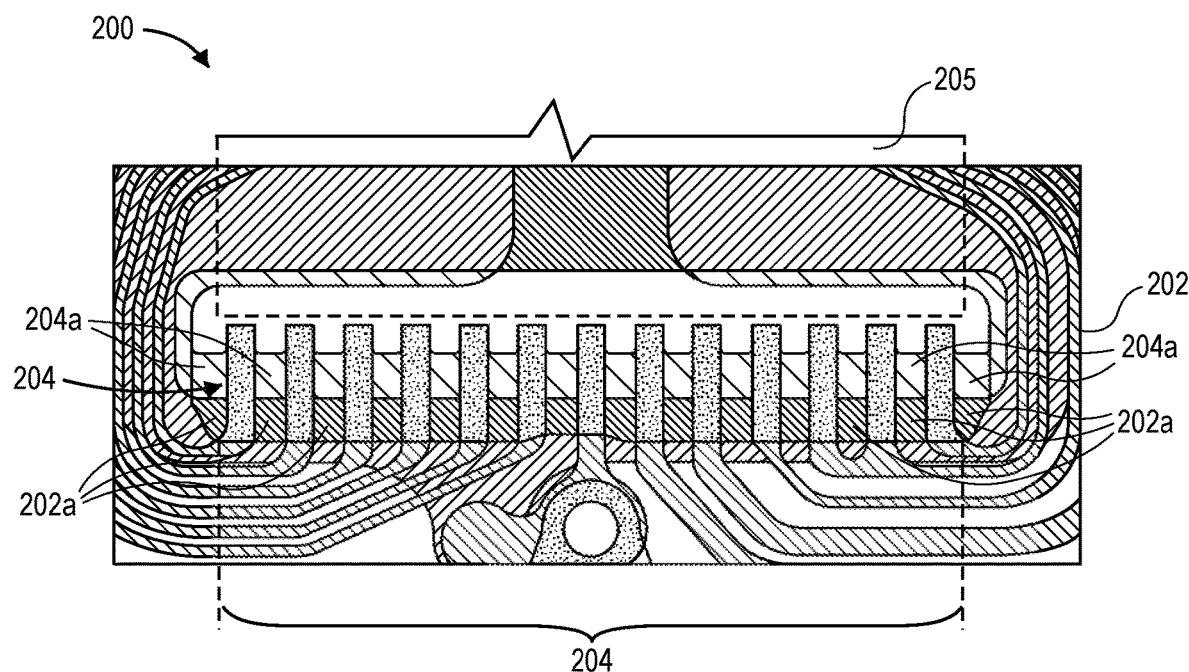
FIG. 2A is a top view illustrating a 13-pad configuration for a suspension flexure, according to an embodiment.
Figure 2B:
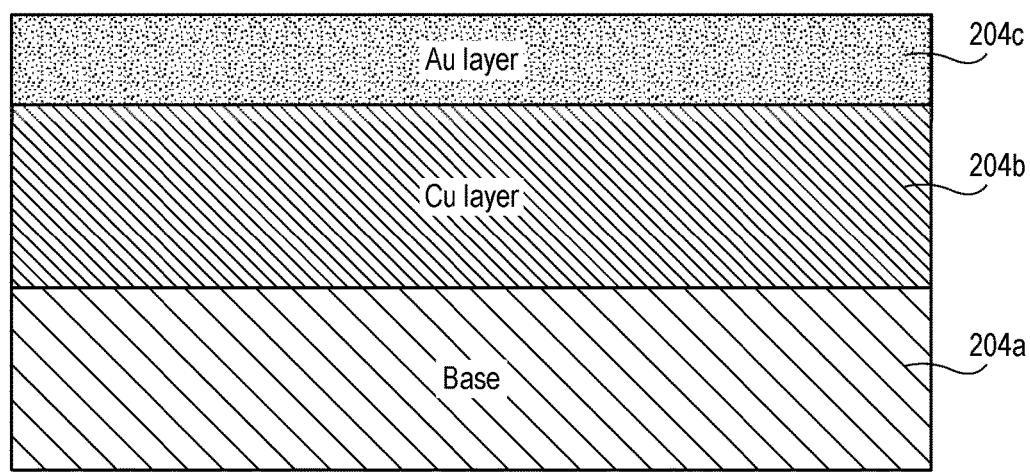
FIG. 2B is a cross-sectional side view illustrating the construction of a flexure electrical pad of FIG. 2A, according to an embodiment.

FIG. 2A is a top view illustrating a 13-pad configuration for a suspension flexure, and FIG. 2B is a cross-sectional side view illustrating the construction of a flexure electrical pad of FIG. 2A, both according to an embodiment. The suspension flexure (or simply "flexure") pad configuration 200 of FIGS. 2A-2B comprises a flexure 202, on which a plurality of electrical connection pads 204 (or simply "electrical pads", "connection pads", "bond pads" or "pads") are coupled. A head slider 205 is also depicted in FIG. 2A in phantom for reference purpose. The flexure 202 of configuration 200 comprises surface(s) such as PI layer 202a (only some of which are labeled, for clarity) typically composed of the polyimide ("PI") polymer. The pad 204 configuration comprises a pad base layer 204a which supports a copper layer 204b (or "Cu layer") on which lies a gold layer 204c (or "Au layer").

As discussed, it is becoming more and more challenging to connect slider pads to flexure pads using SBJ solder balls, equipment and procedures. Therefore, the use of "pre-solder" processes to form "pre-solder bumps" of solder material (e.g., a metal alloy, commonly composed of tin-lead (Sn-Pb), or a lead-free material), instead of SBJ is contemplated. "Pre-solder" generally refers to pre-forming solder bumps onto a pad prior to a reflow-based component bonding procedure. In the context of FIG. 2A that would mean that pre-solder bumps of solder material are formed onto or over each pad 204, so that each pre- solder bump can be heated to reflow to then electrically bond with a corresponding slider pad. There are at least two types of pre-solder processes using photoresist that are under consideration for this pre-solder purpose, "solder plating" and "solder paste printing and reflow". Generally with a metal plating process, a material is in some way deposited (e.g., spraying, electroplating, electroless plating, and the like) onto a workpiece. Generally with a solder paste printing process, a solder material is in some way spread onto a workpiece with a squeegee through a mask (e.g., stencil, photoresist, and the like) and then reflowed by heating to take a desirable form.

Solder bumps on flexure tail-pads are currently formed with solder paste printing and reflow using metal mask, but the metal mask is not considered a good candidate for forming the bumps on flexure head-pads because a head-pad is smaller than the tail-pad and the pattern pitch is also narrower. Furthermore, pre-solder process using photoresist has some challenges, and it is difficult to apply to mass production of flexures. For example, the flexure may be undesirably deformed in the resist patterning and/or the resist stripping after solder bump formation. In the case of film resist (not liquid), the film attachment procedure may also cause flexure deformation. In any case, the pre-solder may be damaged in the resist stripping procedure and/or resist residue may remain after resist stripping.

Figure 3:
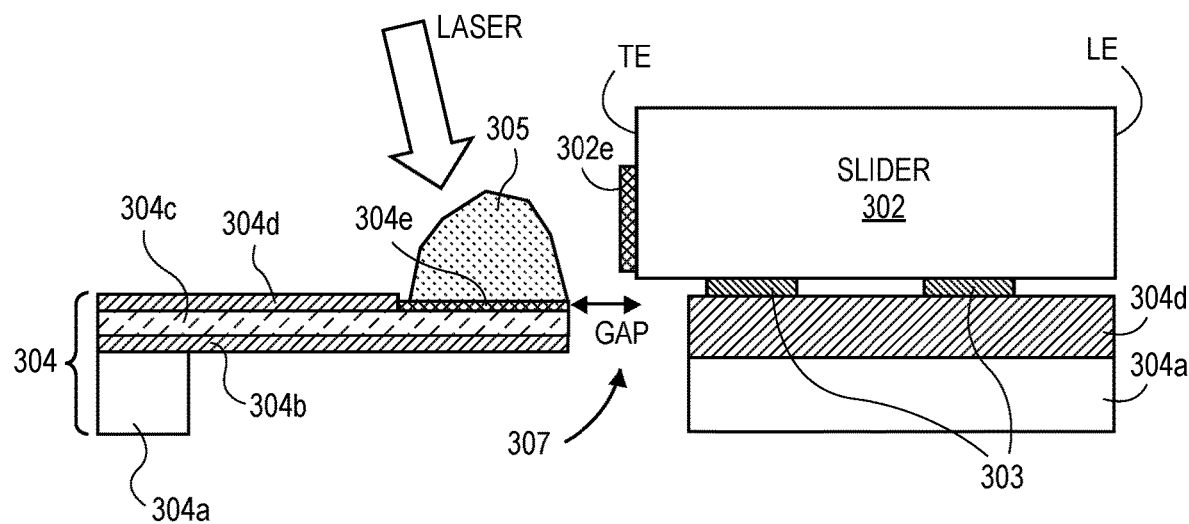
FIG. 3 is a side view diagram illustrating attachment of a slider to a flexure, according to an embodiment.

FIG. 3 is a side view diagram illustrating attachment of a slider to a flexure, according to an embodiment. In a slider mounting and electrical connecting process, after a slider 302 is mechanically attached to the flexure 304 (comprising, e.g., a stainless steel substrate 304a, an insulative PI base layer 304b, a copper conductive layer 304c, and a cover PI layer 304d), such as by adhering the slider to a pair of studs 303 over part of the cover layer 304d, laser irradiation is commonly used to melt each pre-solder bump 305 on the flexure electrical pad 304e (or "head-pad", to distinguish from a flexure "tail-pad") to connect the flexure 304 electrical head-pad 304e and a corresponding slider 302 electrical pad 302e located on a trailing edge (TE) opposite a leading edge (LE) of the slider 302. However, certain scenarios may present challenges with such a process in that the laser irradiation cannot connect the mating pads because of a gap 307 between the pair of pads 304e/302e. That is, the solder is agglomerated on the flexure 304 side but does not flow to the slider pad 302e and, therefore, a solder bridge between the pads 304e/302e is not formed.

Method for Manufacturing a Hard Disk Drive Flexure Assembly

Figure 4:
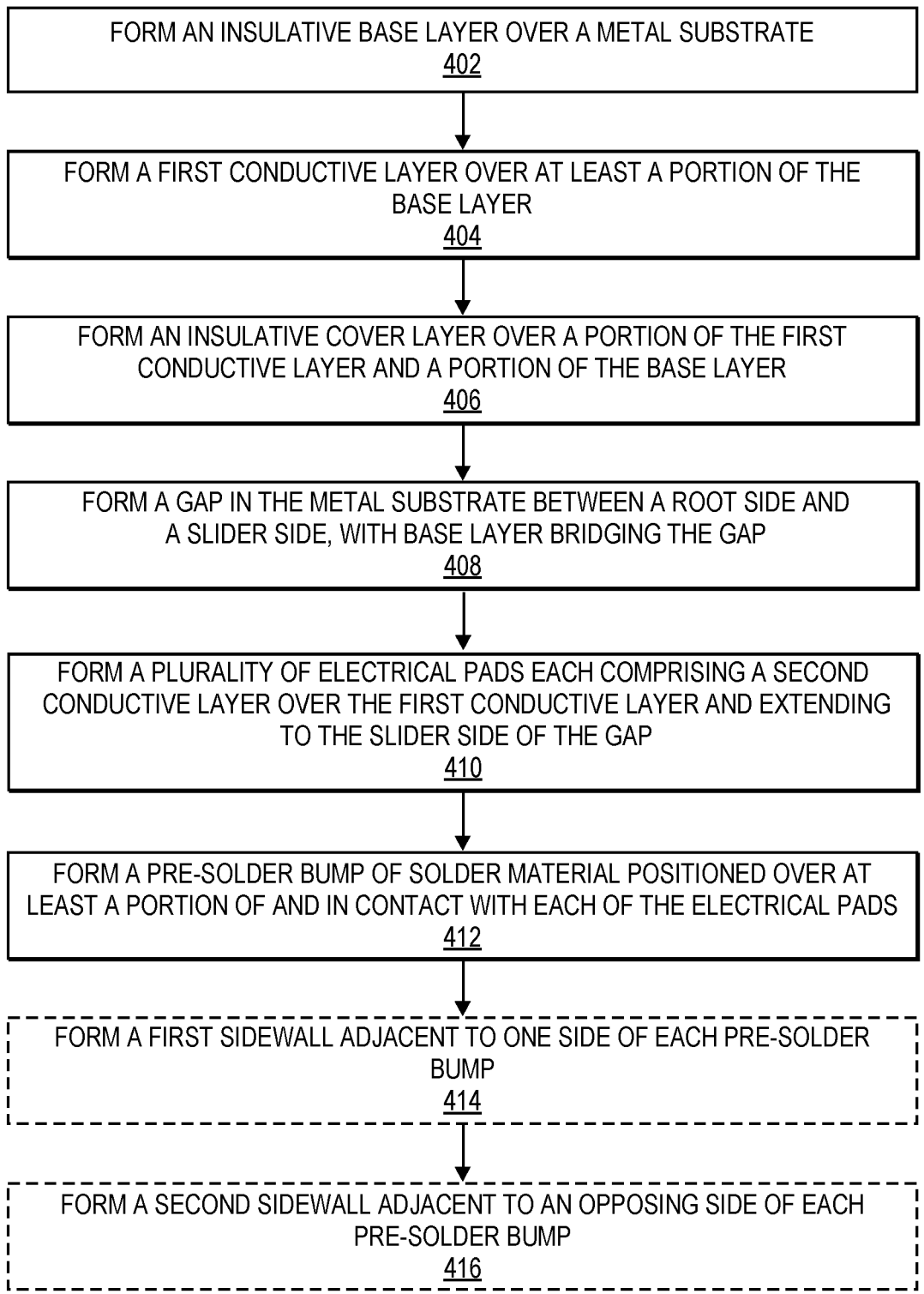
FIG. 4 is a flow diagram illustrating a method of manufacturing a hard disk drive flexure assembly, according to an embodiment.
Figure 5:
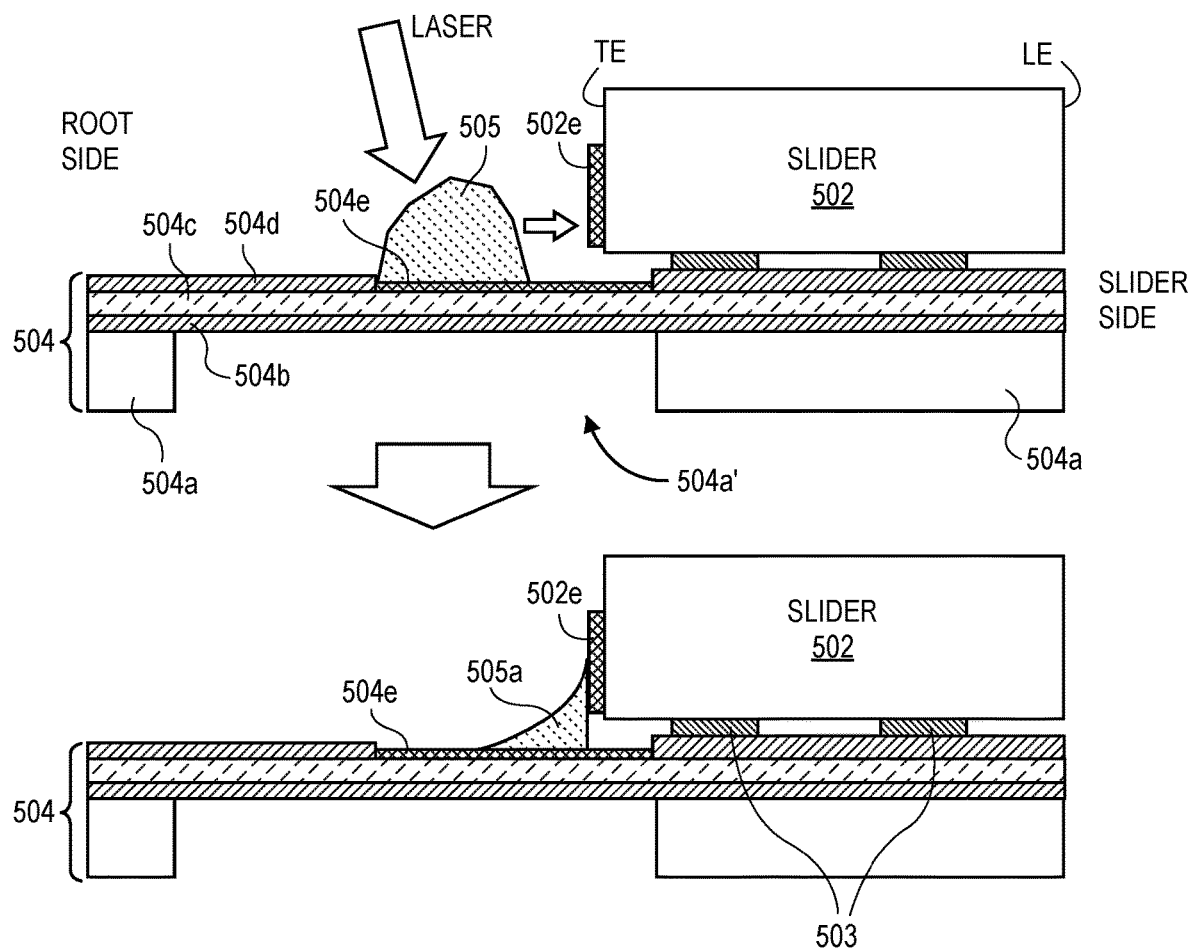
FIG. 5 is a diagram illustrating attachment of a slider to an extended-pad pre-solder flexure, according to an embodiment.

FIG. 4 is a flow diagram illustrating a method of manufacturing a hard disk drive flexure assembly, according to an embodiment. For example, blocks 402-416 may be utilized to form a flexure part or component of a lead suspension for installation into a hard disk drive. FIG. 5 is a diagram illustrating attachment of a slider to an "extended-pad" pre-solder flexure, according to an embodiment. Following, the diagram of FIG. 5 is used as a non-limiting illustrative example implementation of the method of FIG. 4.

At block 402, form an insulative base layer over a metal substrate layer. For example, base layer 504b, such as a polyimide polymer layer (see also base layer 204a of FIGS. 2A-2B), is formed over the metal substrate 504a, such as a stainless steel (SST) layer, according to known manufacturing process techniques.

At block 404, form a first conductive layer over at least a portion of the base layer. For example, first conductive layer 504c, such as a copper printed circuit layer (see also copper layer 204b of FIG. 2B), is formed over the base layer 504b according to known manufacturing process techniques.

At block 406, form an insulative cover layer over a portion of the first conductive layer and a portion of the base layer. For example, cover layer 504d, such as a polyimide polymer cover layer, is formed over a portion of first conductive layer 504c and a portion of base layer 504b.

At block 408, form a gap in the metal substrate with the base layer bridging the gap. For example, gap 504a' is formed in the metal substrate 504a, such as by etching, with the base layer 504b bridging the gap 504a'. The gap 504a' is formed under the portion of the first conductive layer 504c over which electrical pads 504e will be formed at block 410. Gap 504a' is shown in the substrate 504a between the root side and the slider side of the flexure 504.

At block 410, form a plurality of electrical pads each comprising a second conductive layer over the first conductive layer and extending to the slider side of the flexure. For example, a plurality of electrical pads 504e each comprising a second conductive layer, such as a nickel/gold layer(s) (see also gold layer 204c of FIG. 2B), are formed over the first conductive layer 504c according to known manufacturing process techniques. As depicted in FIG. 5 and according to an embodiment, the electrical pads 504e are formed such that each electrical pad 504e extends to the slider side of the flexure 504, e.g., substantially bridging the gap 504a'. As further depicted in FIG. 5 and according to an embodiment, a head slider 502 comprises a plurality of electrical pads 502e, located on a trailing edge (TE) opposite a leading edge (LE) of the slider 502, to which the plurality of electrical pads 504e of the flexure 504 are electrically connected, and each of the plurality of electrical pads 504e of the flexure 504 extends beyond the TE position of a corresponding electrical pad 502e of the head slider 502. As further depicted in FIG. 5 and according to an embodiment, each of the plurality of electrical pads 504e of the flexure 504 extends further beyond a TE position of the main body of the head slider 502.

At block 412, form a pre-solder bump of solder material positioned over at least a portion of and in contact with each of the electrical pads. For example, a pre-solder bump 505 of solder material is formed over at least a portion of and in contact with each of the electrical pads 504e of the flexure 504 according to known manufacturing process techniques. For non-limiting examples, solder plating or solder paste printing and reflow techniques may be used to form each pre-solder bump 505.

Once an "extended-pad" pre-solder flexure 504 assembly having extended electrical pads 504e is constructed, such as according to the method of FIG. 4, the plurality of electrical pads 504e of the flexure 504 may be electrically connected to corresponding electrical pads 502e of the slider 502, now adhered to one or more stud 503 (e.g., of PI material), such as by applying laser irradiation or some other form of heat to each pre-solder bump 505 to reflow the solder material into an electrical bonding form.

Use of an "extended" flexure head-pad as manufactured, illustrated and described herein facilitates, enables, enhances the formation of a viable, functional solder bridge 505a (or "fillet") and resultant electrical connection between the flexure 504 electrical pads 504e and the slider 502 electrical pads 502e because the melted solder (from pre-solder bump 505) can readily spread on the extended head-pad 504e surface and reach the slider pad 502e when the pre-solder bump 505 is irradiated with a laser. This is due at least in part because the electrical pad 504e surface material (e.g., gold) has higher solder wettability than that of a cover layer 504d surface material (e.g. PI). Hence, head-gimbal assembly (HGA) manufacturing failures are inhibited and consequent increased costs avoided. The techniques described herein are especially useful in relatively high-density, small pitch, narrow electrical pads, such as in a configuration of thirteen or more pads for example.

However, even in view of the relatively low solder wettability of a PI cover layer 504d material, when a pre-solder bump (see, e.g., pre-solder bump 505 of FIG. 5) on a flexure head-pad (see, e.g., electrical pads 504e of FIG. 5) is heated to melt the pre-solder bump solder material to spread on the extended flexure head-pad surface, there may remain a risk that the solder material further spreads onto and/or across the PI cover layer 504d. This could cause an undesirable short circuit to or with an adjacent electrical pad. Thus, according to an embodiment, sidewalls may be implemented to combat such undesirable overflow.

Figure 6:
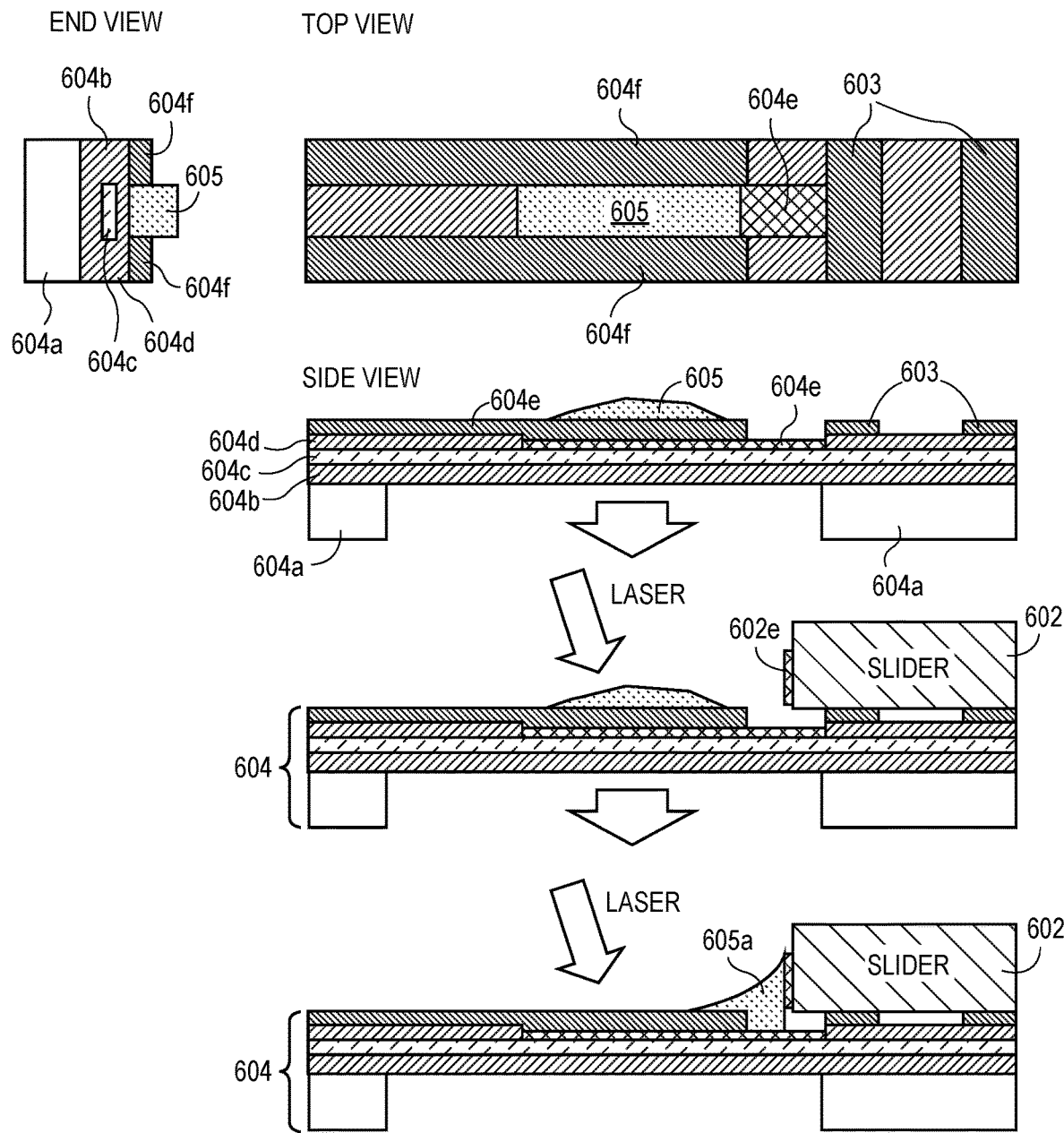
FIG. 6 is a diagram illustrating attachment of a slider to an extended-pad pre-solder flexure with sidewalls, according to an embodiment.

FIG. 6 is a diagram illustrating attachment of a slider to an extended-pad pre-solder flexure with sidewalls, according to an embodiment. Following, the diagram of FIG. 6 is used as a non-limiting illustrative example implementation of optional step(s) of the method of FIG. 4.

At optional block 414, form a first sidewall adjacent to one side of each pre-solder bump. For example, a first sidewall 604f, such as a polyimide polymer layer, is formed over a cover layer 604d and longitudinally (e.g., in the flexure root-side to slider-side direction) along one side of each pre-solder bump 605 according to known manufacturing process techniques. Similarly, at optional block 416 form a second sidewall adjacent to the opposing side of each pre-solder bump. For example, a second polyimide sidewall 604f is formed over the cover layer 604d and along the other side of each pre-solder bump 605 according to known manufacturing process techniques.

Similarly to the flexure 504 of FIG. 5, flexure 604 is constructed of a series of layers. Hence, flexure 604 also comprises a metal (e.g., stainless steel) substrate 604a, an insulative (e.g., PI) base layer 604b, a conductive (e.g., copper) layer 604c, and a cover (e.g., PI) layer 604d, over which each sidewall 604f is formed. Formation of the sidewalls 604f may be implemented before or after formation of each corresponding pre-solder bump 605, preferably before. As discussed, the sidewalls 604f prohibit or at least inhibit the undesirable flow of solder material of solder bridge 605a (formerly pre-solder bump 605) between adjacent electrical pads 604e, 602e, such as during the solder reflow process utilized to electrically connect the plurality of electrical pads 604e of flexure 604 to corresponding electrical pads 602e of slider 602 adhered to one or more stud 603 (e.g., PI).

Furthermore, even in view of the foregoing approaches to manufacturing a hard disk drive (HDD) flexure assembly having pre-solder bumps, a number of solder reflow enhancements are contemplated to further ensure the formation of a more reliable electrical connection or bond between the flexure part of a suspension and the head slider.

According to an embodiment, while connecting the flexure pads 504e, 604e and slider electrical pads 502e, 602e via the solder bump 505, 605 using laser irradiation, the suspension including the flexure 504, 604 is positioned and held at an angle between horizontal and vertical. For example, the flexure-slider assembly may be held at an angle such that the flexure is vertically above the slider. Hence, the force of gravity is utilized to encourage the melted solder from each pre-solder bump 505, 605 to flow downward toward the slider 502, 602 and corresponding slider electrical pads 502e, 602e and to therefore to form a suitable solder bridge 505a, 605a.

According to an embodiment, while connecting the flexure pads 504e, 604e and slider electrical pads 502e, 602e via the solder bump 505, 605 using laser irradiation, heated nitrogen gas (which helps prevent solder from oxidizing) is blown or otherwise directed onto each pre-solder bump/melted solder. Hence, the force associated with the pressurized gas is utilized to encourage the melted solder from each pre-solder bump 505, 605 to flow from each flexure electrical pad 504e, 604e on which it is formed toward the slider 502, 602 and each corresponding slider electrical pad 502e, 602e and to thus form a suitable solder bridge 505a, 605a. According to a related embodiment, the foregoing techniques are used in combination, whereby the flexure-slider assembly is held at an angle such that the flexure is vertically above the slider and heated nitrogen gas is directed onto each pre-solder bump/melted solder while connecting the flexure pads 504e, 604e and slider electrical pads 502e, 602e via the solder bump 505, 605.

Mask Configuration for Good Pre-Solder Bump

As discussed, solder plating or solder paste printing and reflow techniques may be used to form each pre-solder bump (see, e.g., pre-solder bump 505, 605 of FIGS. 5, 6), which may employ some form of masking, such as a photoresist (or simply "resist"), in order to properly position the pre-solder bump solder material where desired, i.e., for solder patterning.

Figure 7:
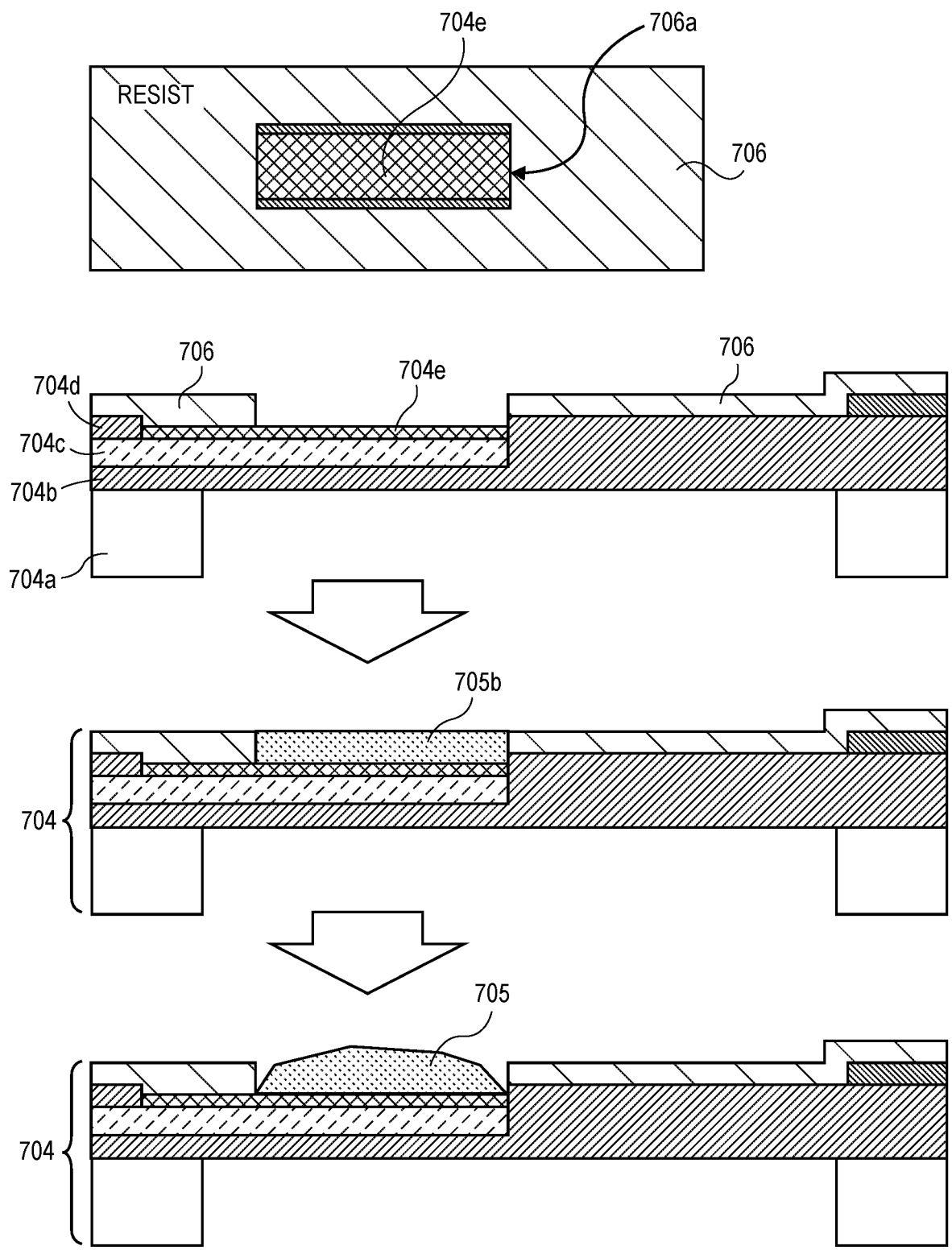
FIG. 7 is a side view diagram illustrating multi-stage formation of pre-solder bump on a flexure using photoresist, according to an embodiment.

FIG. 7 is a side view diagram illustrating multi-stage formation of pre-solder bump on a flexure using photoresist, according to an embodiment. Similarly to flexure 504 of FIG. 5 and flexure 604 of FIG. 6, flexure 704 is again constructed of a series of layers, comprising a metal (e.g., stainless steel) substrate 704a, an insulative (e.g., PI) base layer 704b, a conductive (e.g., copper) layer 704c, and a cover (e.g., PI) layer 704d, as well as the conductive (e.g., gold) electrical pads 704e. Here, flexure 704 is depicted with a mask 706 overlying the workpiece, where a mask opening 706a over the underlying electrical pad 704e on which each pre-solder bump 705 is formed is only at the tip portion (i.e., slider side) of the underlying pad. With such a mask configuration, the pre-solder bump 705 height may be unsatisfactory because the volume of solder paste 705b (or plating) may be insufficient. Alternatively, if the mask opening over the underlying electrical pad is enlarged to open further beyond the tip portion of the underlying pad to increase the amount of solder material applied to the flexure through the mask, then the mask opening would then extend over a portion of the PI cover layer 704d, which is again considered unsatisfactory and undesirable in the context of forming a suitable pre-solder bump.

Figure 8:
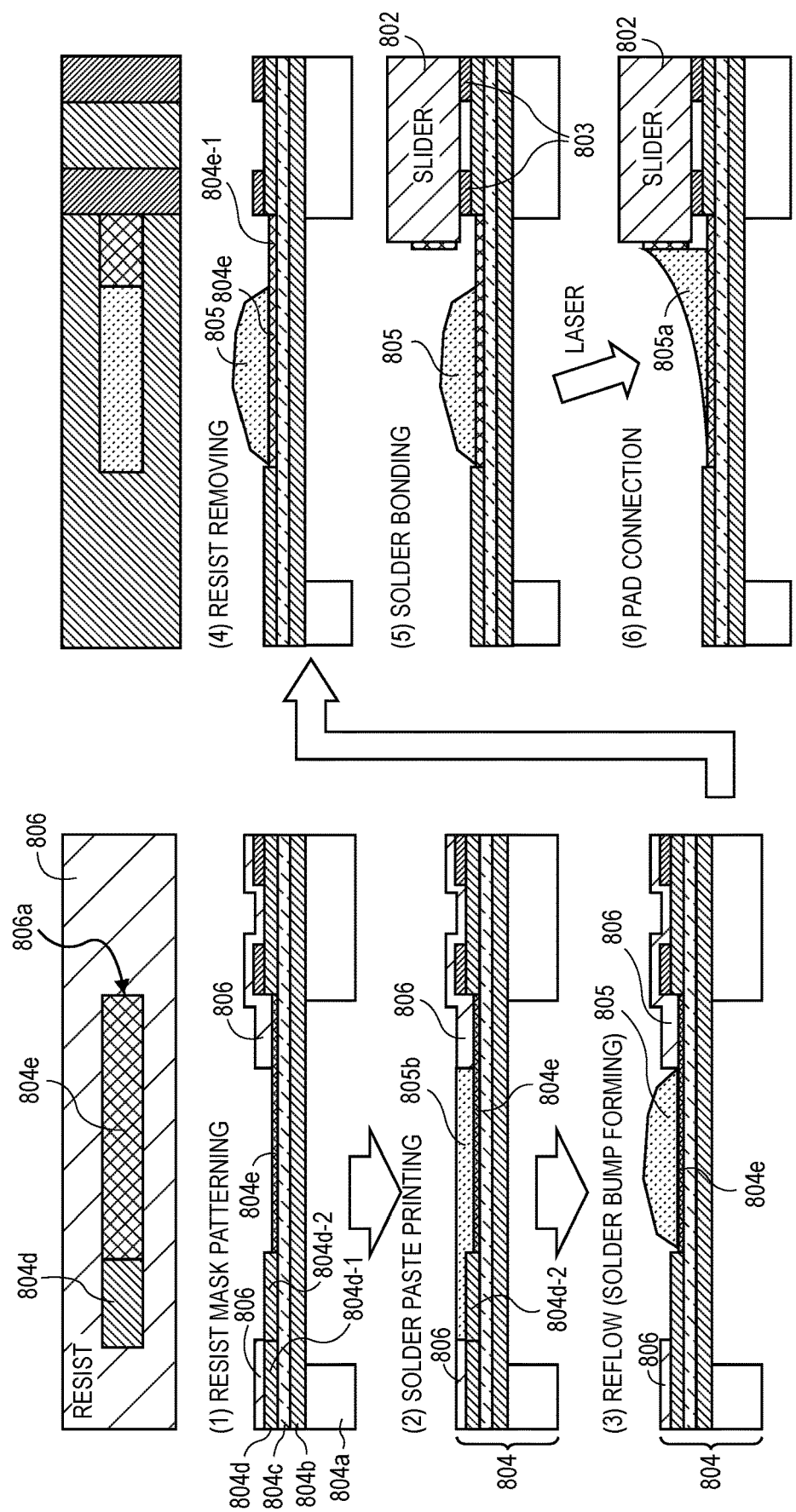
FIG. 8 is a side view diagram illustrating multi-stage attachment of a slider to an extended-pad pre-solder flexure using photoresist, according to an embodiment.

FIG. 8 is a side view diagram illustrating multi-stage attachment of a slider to an extended-pad pre-solder flexure using photoresist, according to an embodiment. Similarly to flexure 504 (FIG. 5), 604 (FIG. 6), 704 (FIG. 7), flexure 804 is again constructed of a series of layers, comprising a metal (e.g., stainless steel) substrate 804a, an insulative (e.g., PI) base layer 804b, a conductive (e.g., copper) layer 804c, and a cover (e.g., PI) layer 804d, as well as the conductive (e.g., gold) electrical pads 804e. According to an embodiment, and with reference to the method of FIG. 4, prior to forming the pre-solder bumps (block 412), a mask is applied over a first portion of the cover layer thereby leaving a second portion of the cover layer unmasked at the root side of each electrical pad, i.e., labeled in FIG. 8 as "RESIST MASK PATTERNING" stage. For example, prior to forming pre-solder bumps 805 on flexure 804, a mask 806 is applied over a first portion 804d-1 of the cover layer 804d thereby leaving a second portion 804d-2 of the cover layer 804d unmasked at the root side of each electrical pad 804e to ensure application of a required volume of solder for the pre-solder bumps 805, while avoiding the risk of interference between formed pre-solder bumps 805 and the slider 802 at the tip portion.

According to an embodiment, and with reference to the method of FIG. 4, forming the pre-solder bumps (block 412) may further comprise applying a solder paste over the unmasked second portion of the cover layer, i.e., labeled in FIG. 8 as "SOLDER PASTE PRINTING" stage. For example, solder paste 805b is applied over the unmasked second portion 804d-2 of the cover layer 804d. Then, the solder paste is reflowed to flow away from the second portion of the cover layer to form each pre-solder bump over each corresponding electrical pad, i.e., labeled in FIG. 8 as "REFLOW (SOLDER BUMP FORMING)" stage. For example, solder paste 805b is reflowed to flow away from the second portion 804d-2 of the cover layer 804d to form each pre-solder bump 805 over each corresponding electrical pad 804e.

According to an embodiment, applying the mask includes applying the mask over a portion of each electrical pad, as depicted in stages (2) and (3) of FIG. 8. Then, after reflowing the solder paste (see stage (3) of FIG. 8) the mask is removed thereby leaving a portion of each electrical pad uncovered by the pre-solder bump, i.e., labeled in FIG. 8 as "RESIST REMOVING" stage. For example, mask 806 is removed from the workpiece according to known manufacturing process techniques and a portion 804e-1 of each electrical pad 804e is left uncovered by the pre-solder bump 805, as depicted in "extended pad" form of electrical pads 504e, 604e, 804e (FIGS. 5, 6, and 8). From that point in the multi-stage attachment process of FIG. 8, "SLIDER BONDING" and "PAD CONNECTION" are performed as described elsewhere herein, e.g., by adhering slider 802 to one or more studs 803 and then irradiating pre-solder bump 805 to form solder bridge 805a.

Hence, with the foregoing mask configuration, an "extended pad" (see, e.g., electrical pads 504e of FIG. 5 and the method of FIG. 4) can be implemented to provide the corresponding benefits as described, and the pre-solder bump 805 height is satisfactory because the volume of solder paste 805b (or plating) is now sufficient due to the additional solder paste 805b applied over the unmasked second portion 804d-2 of the cover layer 804d.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexure product for a suspension assembly for a hard disk drive (HDD), the flexure comprising:
    a metal substrate comprising a gap between a bonding side of the substrate and a slider-supporting side of the substrate;
    an insulative base layer over at least a portion of the substrate and including a bridging portion spanning the gap in a direction approaching the slider-supporting side;
    a first conductive layer over at least a portion of the base layer and including a bridging portion spanning the gap in the direction approaching the slider-supporting side;
    a plurality of electrical pads each comprising a second conductive layer over and fully supported by the bridging portions of the first conductive layer and the base layer and extending to the slider-supporting side of the gap; and
    a plurality of pre-formed solder bumps of solder material each pre-positioned over at least a portion of and in contact with and configured for continuous support by a corresponding electrical pad of the plurality of electrical pads.

2. The flexure product of claim 1, further comprising:
    a first sidewall adjacent to one side of each pre-formed solder bump and extending in a longitudinal direction along the bonding side to the slider-supporting side; and
    a second sidewall adjacent to an opposing side of each pre-formed solder bump and extending in the longitudinal direction.

3. The flexure product of claim 1, wherein each pre-formed solder bump does not cover a slider-supporting side portion of the corresponding electrical pad.

4. A method for manufacturing a flexure assembly for a hard disk drive, the method comprising:
    forming an insulative base layer over a metal substrate;
    forming a first conductive layer over at least a portion of the base layer;
    forming a gap in the metal substrate between a bonding side of the substrate and a slider-supporting side of the substrate such that the base layer includes a bridging portion spanning the gap in a direction approaching the slider-supporting side and supporting a bridging portion of the first conductive layer spanning the gap in the direction approaching the slider-supporting side;
    forming a plurality of electrical pads each comprising a second conductive layer over and fully supported by the bridging portions of the first conductive layer and the base layer and extending to the slider-supporting side of the gap; and
    forming a plurality of pre-formed solder bumps of solder material each pre-positioned over at least a portion of and in contact with and configured for continuous support during reflow by a corresponding electrical pad of the plurality of electrical pads.

5. The method of claim 4, further comprising:
    forming a first sidewall adjacent to one side of each pre-formed solder bump; and
    forming a second sidewall adjacent to an opposing side of each pre-formed solder bump.

6. The method of claim 4, further comprising:
    electrically connecting the plurality of electrical pads to corresponding electrical pads of a head slider employing laser irradiation of each pre-formed solder bump.

7. The method of claim 6, wherein electrically connecting the electrical pads of the flexure assembly to the corresponding electrical pads of the head slider includes directing heated nitrogen gas onto each pre-formed solder bump while employing the laser irradiation of each pre-formed solder bump.

8. The method of claim 6, wherein electrically connecting the electrical pads of the flexure assembly to the corresponding electrical pads of the head slider includes holding the flexure assembly and head slider at an angle between horizontal and vertical while employing the laser irradiation of each pre-formed solder bump.

9. The method of claim 8, wherein electrically connecting the electrical pads of the flexure assembly further includes directing heated nitrogen gas onto each pre-formed solder bump while employing the laser irradiation of each pre-formed solder bump.

10. The method of claim 4, further comprising:
    forming an insulative cover layer over a portion of the first conductive layer and a portion of the base layer;
    prior to forming the pre-formed solder bump, applying a mask over a first portion of the cover layer thereby leaving a second portion of the cover layer unmasked at the bonding side of each electrical pad.

11. The method of claim 10, wherein forming the pre-formed solder bump comprises:
    applying a solder paste over the unmasked second portion of the cover layer; and
    reflowing the solder paste to flow the solder paste away from the second portion of the cover layer to form each pre-formed solder bump over each corresponding electrical pad.

12. The method of claim 11, wherein:
    applying the mask includes applying the mask over a portion of each electrical pad; and
    after reflowing the solder paste, removing the mask thereby leaving a portion of each electrical pad uncovered by the corresponding pre-formed solder bump.

13. A hard disk drive (HDD) comprising:
    a disk medium rotatably mounted on a spindle;
    a suspension assembly comprising a flexure comprising:
        a metal substrate comprising a gap between a slider trailing edge side of the substrate and a slider-supporting side of the substrate with which at least one slider-adhering stud is coupled,
        an insulative base layer over at least a portion of the substrate and including a bridging portion spanning the gap in the substrate in a direction approaching the slider-supporting side,
        a first conductive layer over at least a portion of the base layer and including a bridging portion spanning the gap in the substrate in the direction approaching the slider-supporting side,
        a plurality of electrical pads each comprising a second conductive layer over and fully supported by the bridging portions of the first conductive layer and the base layer and extending to the slider-supporting side of the gap, and a plurality of pre-solder bumps of solder material each pre-positioned over at least a portion of and in contact with and configured for continuous support by a corresponding electrical pad of the plurality of electrical pads;

a head slider housing a read-write transducer configured to read from and to write to the disk medium, the head slider mounted on the at least one slider-adhering stud of the suspension assembly and electrically connected to the plurality of electrical pads of the flexure via the pre-solder bump solder material; and means for moving the head slider to access portions of the disk medium.

14. The HDD of claim 13, wherein:

the head slider comprises a plurality of electrical pads to which the plurality of electrical pads of the flexure are electrically connected; and each of the plurality of electrical pads of the flexure extends beyond a position of a corresponding electrical pad of the head slider.

15. The HDD of claim 13, wherein each of the plurality of electrical pads of the flexure extends beyond a trailing edge toward a leading edge of the head slider.

16. The HDD of claim 13, wherein the solder material of each pre-solder bump does not cover a slider-supporting side portion of the corresponding electrical pad of the flexure.

17. The HDD of claim 13, further comprising:

a first flexure sidewall adjacent to one side of the solder material of each pre-solder bump and extending in a longitudinal direction along the slider trailing edge side to the slider-supporting side; and a second flexure sidewall adjacent to an opposing side of the solder material of each pre-solder bump and extending in the longitudinal direction.

18. The flexure product of claim 1, wherein each of the plurality of electrical pads is composed at least in part of gold.

19. The HDD of claim 13, wherein each of the plurality of electrical pads of the flexure is composed at least in part of gold.

* * * * *